(12) United States Patent
Sakai et al.

(10) Patent No.: US 8,225,660 B2
(45) Date of Patent: Jul. 24, 2012

(54) DYNAMIC QUANTITY SENSOR AND METHOD OF MANUFACTURING THE SAME

(75) Inventors: Minekazu Sakai, Kariya (JP); Takashi Katsumata, Kariya (JP); Yoshiaki Murakami, Nagoya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 12/792,404

(22) Filed: Jun. 2, 2010

(65) Prior Publication Data

US 2010/0307242 A1 Dec. 9, 2010

(30) Foreign Application Priority Data

Jun. 3, 2009 (JP) ................................ 2009-134313

(51) Int. Cl.
*G01P 9/04* (2006.01)
*G01P 1/02* (2006.01)
*G01C 19/56* (2006.01)
(52) U.S. Cl. .................... 73/504.12; 73/504.14; 73/493
(58) Field of Classification Search ............... 73/504.12, 73/504.14, 504.16, 504.04, 504.02, 493
See application file for complete search history.

(56) References Cited

U.S. PATENT DOCUMENTS

| | | | | |
|---|---|---|---|---|
| 7,603,903 B2 * | 10/2009 | Ohta | ........................... | 73/504.12 |
| 7,762,134 B2 * | 7/2010 | Katsumata | ................. | 73/504.12 |
| 2004/0232507 A1 | 11/2004 | Furukubo et al. | | |
| 2006/0097331 A1 | 5/2006 | Hattori et al. | | |
| 2008/0066546 A1 | 3/2008 | Katsumata | | |
| 2010/0059244 A1 | 3/2010 | Ishii | | |

FOREIGN PATENT DOCUMENTS

| | | |
|---|---|---|
| JP | A-H6-326331 | 11/1994 |
| JP | A-H10-189815 | 7/1998 |
| JP | A-2003-46096 | 2/2003 |
| JP | A-2004-3886 | 1/2004 |
| JP | A-2006-332271 | 12/2006 |
| JP | A-2007-335457 | 12/2007 |
| JP | A-2008-76153 | 4/2008 |
| WO | WO 2008/013049 | 1/2008 |
| WO | WO 2008/108413 | 9/2008 |

* cited by examiner

*Primary Examiner* — Helen C. Kwok
(74) *Attorney, Agent, or Firm* — Posz Law Group, PLC

(57) ABSTRACT

A dynamic quantity sensor includes a sensor chip, a base member, and bumps. The sensor chip includes a semiconductor substrate, a sensor part, and sensor pads electrically coupled with the sensor part. The base member includes a base substrate and base pads disposed on the base substrate. The bumps mechanically and electrically couple the sensor pads and the base pads, respectively, in a state where the sensor chip is curved with respect to the base member. The sensor pads include input pads and output pads. The first surface of the semiconductor substrate includes a first portion and a second portion. The first portion is closer to the base substrate than the second portion is. At least one of the input pads is disposed on the first portion and at least one of the output pads is disposed on the second portion.

9 Claims, 7 Drawing Sheets

DYNAMIC QUANTITY SENSOR AND METHOD OF MANUFACTURING THE SAME

CROSS REFERENCE TO RELATED APPLICATIONS

The present application is based on and claims priority to Japanese Patent Application No. 2009-134313 filed on Jun. 3, 2009, the contents of which are incorporated in their entirety herein by reference.

BACKGROUND OF THE INVENTION

1. Field of the Invention

The present invention relates to a dynamic quantity sensor including a sensor chip and a base member that are mechanically and electrically coupled with each other through a plurality of bumps. The present invention also relates to a method of manufacturing the dynamic quantity sensor.

2. Description of the Related Art

US 2008/0066546 A1 (corresponding to JP-A-2008-76153) discloses a dynamic quantity sensor including a sensor chip and a base member. The sensor chip has a surface on which a plurality of pads is disposed. The substrate has a surface on which a plurality of pads is disposed. The sensor chip and the substrate are mechanically and electrically coupled through a plurality of bumps.

When the sensor chip and the base member are mechanically and electrically coupled through the bumps, the sensor chip may curve due to a load, and the sensor chip may be coupled with the base member in a state where the sensor chip curves. In a case where the sensor chip curves in such a manner that a center portion of the sensor chip is convex with respect to the base member compared with an edge portion surrounding the center portion, a stress concentration occurs in the bumps that are coupled with the pads disposed at the edge portion, and thereby the bumps may crack or the bumps may be easily detached from the pads. In a case where the sensor chip curves in such a manner that the center portion of the sensor chip is concave with respect to the base member compared with the edge portion, a stress concentration occurs in the bumps that are coupled with the pads disposed at the center portion, and thereby the bumps may crack or the bumps may be easily detached from the pads. When a bad connection occurs between the sensor chip and the base member, noise may be generated in an output signal of the sensor chip.

The dynamic quantity sensor disclosed in US 2008/0066546 A1 does not have a configuration for determining whether a bad connection occurs between the sensor chip and the base member.

SUMMARY OF THE INVENTION

In view of the foregoing problems, it is an object of the present invention to provide a dynamic quantity sensor that can determine whether a bad connection occurs between a sensor chip and a base member. Another object of the present invention is to provide a method of manufacturing the dynamic quantity sensor.

A dynamic quantity sensor according to an aspect of the present invention includes a sensor chip, a base member, and a plurality of bumps. The sensor chip includes a semiconductor substrate, a sensor part, and a plurality of sensor pads. The semiconductor substrate has a first surface and a second surface opposing each other. The sensor part is disposed on the semiconductor substrate and configured to detect a dynamic quantity. The sensor pads are disposed on the first surface of the semiconductor substrate and are electrically coupled with the sensor part. The base member has a base substrate and a plurality of base pads. The base substrate has a first surface and a second surface opposing each other. The first surface of the base substrate opposes the first surface of the semiconductor substrate. The base pads are disposed on the first surface of the base substrate. Each of the bumps mechanically and electrically couples one of the sensor pads and corresponding one of the base pads in a state where the sensor chip is curved with respect to the base member. The first surface of the semiconductor substrate includes a first portion and a second portion. The first portion is closer to the first surface of the base substrate than the second portion is. The sensor pads include a plurality of input pads for inputting a signal to the sensor part and a plurality of output pads for outputting a signal from the sensor part. At least one of the input pads is disposed on the first portion, and at least one of the output pads is disposed on the second portion.

In the dynamic quantity sensor, it can be determined whether a bad connection occurs between the sensor chip and the base member based on the signal output from the output pads.

In a method of manufacturing the dynamic quantity sensor, the sensor chip and the base member may be mechanically and electrically coupled through the bumps while applying a pressure to the sensor chip so that the sensor ship is curved with respect to the base member.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

Figure 1:
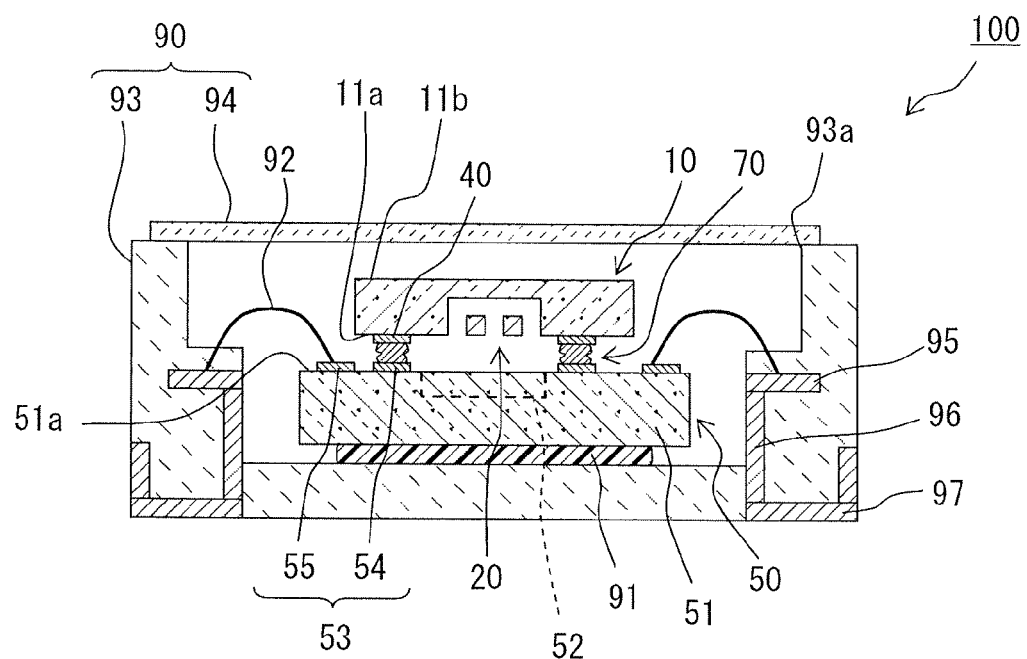
FIG. 1 is a cross-sectional view of a dynamic quantity sensor according to an exemplary embodiment of the present invention.

A dynamic quantity sensor 100 according to an exemplary, embodiment of the present invention will be described with reference to FIG. 1 to FIG. 6B.

The dynamic quantity sensor 100 includes a sensor chip 10, a circuit chip 50, a plurality of bumps 70, and a package 90. The sensor chip 10 and the circuit chip 50 are housed in the package 90. The sensor chip 10 and the circuit chip 50 are mechanically and electrically coupled through the bumps 70. The circuit chip 50 and the package 90 are mechanically coupled with each other through an adhesive 91. The circuit chip 50 and the package 90 are electrically coupled with each other through a plurality of wires 92.

Figure 2:
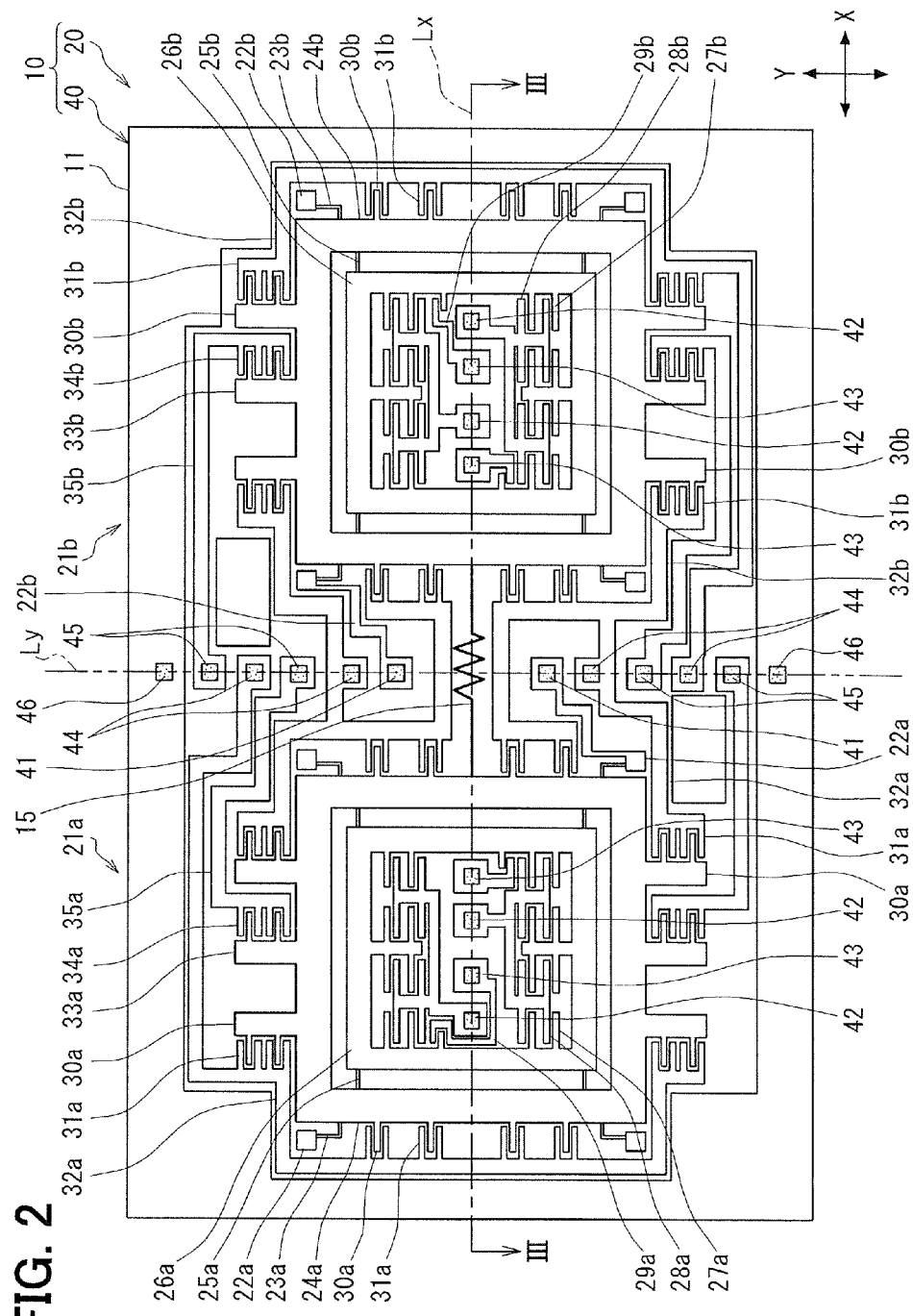
FIG. 2 is a plan view of a sensor chip included in the dynamic quantity sensor.
Figure 3:
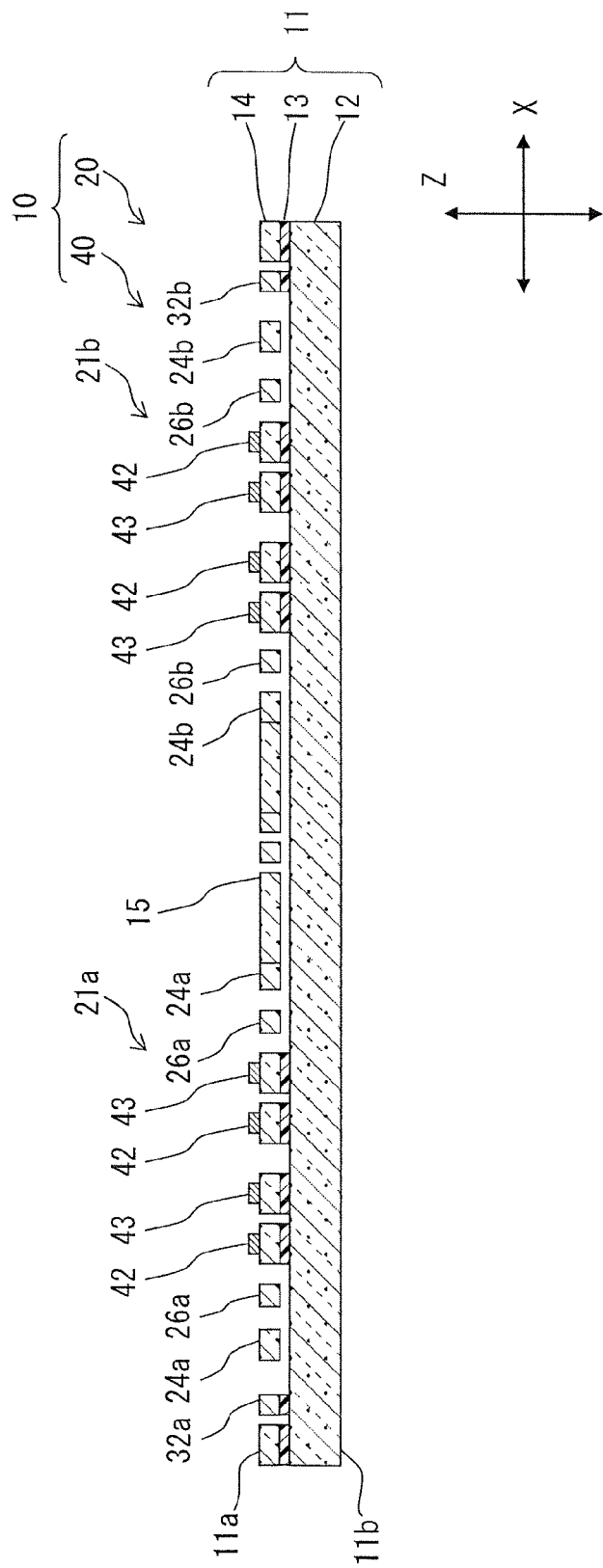
FIG. 3 is a cross-sectional view of the sensor chip taken along line in FIG. 2.

As shown in FIG. 2 and FIG. 3, the sensor chip 10 includes a semiconductor substrate 11, a sensor part 20, and a plurality of sensor pads 40. The semiconductor substrate 11 has a surface extending in an X-axis direction. A direction perpendicular to the X-axis direction is defined as a Y-axis direction, and a direction perpendicular to the X-axis direction and the Y-axis direction is defined as a Z-axis direction. A first virtual straight line dividing the sensor chip 10 into two equal parts in the Y-axis direction and extending along the X-axis direction is shown by a dashed-dotted line Lx. A second virtual straight line dividing the sensor chip 10 into two equal parts in the X-axis direction and extending along the Y-axis direction is shown by dashed-two dotted line Ly. The two virtual straight lines Lx and Ly cross each other in a center portion of the semiconductor substrate 11 and provide a cross line. The semiconductor substrate 11 is a silicon on insulator substrate including a first semiconductor layer 12, an insulating layer 13, and a second semiconductor layer 14 stacked in this order. The sensor part 20 is formed on the first surface 11a, that is, on the second semiconductor layer 14 by a known exposure technique.

The sensor part 20 is configured to detect a dynamic quantity. In the present embodiment, the sensor part 20 is configured to detect an angular velocity as the dynamic quantity. The sensor part 20 includes a pair of detecting sections 21a and 21b. The detecting sections 21a and 21b are located on opposite sides of the second virtual straight second line Ly. A configuration of the detecting section 21a will be described below. Because the detecting sections 21a and 21b have substantially the same configuration, with regard to the detecting section 21b, only a correspondence relationship between the detecting sections 21a and 21b will be described.

The detection section 21a includes an anchor 22a, a first driving beam 23a, a driving frame 24a, a detecting beam 25a, a detecting frame 26a, a first detecting electrode 27a, a second detecting electrode 28a, and a servo electrode 29a as main components for detecting an angular velocity. The driving frame 24a is coupled with the anchor 22a through the first driving beam 23a. The detecting frame 26 is coupled with the driving frame 24a through the detecting beam 25a. The first detecting electrode 27a is disposed on the detecting frame 26a. The second detecting electrode 28a is opposite the first detecting electrode 27a. The servo electrode 29a restricts displacement of the detecting frame 26a in the Y-axis direction based on a signal output from the second detecting electrode 28a.

The detecting section 21a includes a first driving electrode 30a, a second driving electrode 31a, and a second driving beam 32a as main components for driving the driving frame 24a. The first driving electrode 30a is disposed on the driving frame 24a. The second driving electrode 31a is opposite the first driving electrode 30a and is disposed at the second driving beam 32a.

The detecting section 21a includes a first monitoring electrode 33a, a second monitoring electrode 34a, and a monitoring beam 35a as main components for monitoring a driving state of the driving frame 24a. The first monitoring electrode 33a is disposed on the driving frame 24a. The second monitoring electrode 34a is opposite the first monitoring electrode 33a and is disposed on the monitoring beam 35a.

Each of the components 22a-35a of the detecting section 21a can be formed by pattern-etching the second semiconductor layer 14 and the insulating layer 13 in the semiconductor substrate 11. The anchor 22a, the second detecting electrode 28a, the servo electrode 29a, the second driving electrode 31a, the second driving beam 32a, the second monitoring electrode 34a, and the monitoring beam 35 are fixed to the first semiconductor layer 12 through the insulating layer 13. Thus, the above-described components fixed to the first semiconductor layer 12 are not movable with respect to the first semiconductor layer 12.

The first driving beam 23a, the driving frame 24a, the detecting beam 25a, the detecting frame 26a, the first detecting electrode 27a, the first driving electrode 30a, and the first monitoring electrode 33a are in a floating state because the insulating layer 13 under the second semiconductor layer 14 is removed by a sacrifice layer etching. Therefore, the above-described components in the floating state are movable in the X-axis direction and the Y-axis direction with respect to the first semiconductor layer 12.

The anchor 22a holds the driving frame 24a through the first driving beam 23a. As shown in FIG. 2, a first sensor pad 41 is disposed on the anchor 22a disposed in the center portion. The sensor pad 41 is applied with a direct current (DC) voltage. The DC voltage is input to the driving frame 24a through the first driving beam 23a. The DC voltage is also input to the detecting frame 26a through the first driving beam 23a, the driving frame 24a, and the detecting beam 25a. Thus, the driving frame 24a and the detecting frame 26 are at the same potential as the DC voltage.

The driving frame 24a vibrates in the X-axis direction due to electrostatic force. The driving frame 24a has a frame shape including an outer ring portion and an inner ring portion. The first driving beam 23a, the first driving electrode 30a, and the first monitoring electrode 33a are coupled with the outer ring portion. Because the driving frame 24a is at the same potential as the DC voltage, the first driving electrode 30a and the first monitoring electrode 33a disposed on the driving frame 24a are also at the same potential as the DC voltage. The detecting beam 25a is coupled with the inner ring portion of the driving frame 24a. The driving frame 24a is coupled with the detecting frame 26a through the detecting beam 25a. In accordance with the vibration of the driving frame 24a in the X-axis direction, the detecting frame 26a also vibrates in the X-axis direction.

The detecting frame 26a is disposed in a region surrounded by the inner ring portion of the driving frame 24a. The detecting frame 26a has a frame shape including an outer ring portion and an inner ring portion. The outer ring portion of the detecting frame 26a is coupled with the detecting beam 25a.

The first detecting electrode 27a is coupled with the inner ring portion of the detecting frame 26a. Because the detecting frame 26a is at the same potential as the DC voltage, the first detecting electrode 27a disposed on the detecting frame 26 is also at the same potential as the DC voltage.

The second detecting electrode 28a and the servo electrode 29a are disposed in a region surrounded by the inner ring portion of the detecting frame 26a. The second detecting electrode 28a and the servo electrode 29a are opposite the first detecting electrode 27a in the Y-axis direction. On the second detecting electrode 28a, a second sensor pad 42 is disposed. The first detecting electrode 27a and the second detecting electrode 28a provide a first capacitor. The second sensor pad 42 outputs a signal in accordance with a change in an electrostatic capacity of the first capacitor. On the servo electrode 29, a third sensor pad 43 is disposed. The third sensor pad 43 receives a servo voltage that restricts displacement of the detecting frame 26a in the Y-axis direction. The servo voltage is determined based on the output signal of the second sensor pad 42. The servo voltage is detected as a physical quantity that determines the angular velocity.

The first driving electrode 30a and the second driving electrode 31a vibrate the driving frame 24a. On the second driving beam 32a having the second driving electrode 31a, a fourth sensor pad 44 is disposed. The second driving electrode 31a receives a driving voltage from the fourth sensor pad 44 through the second driving beam 32a. A polarity of driving voltage changes with a predetermined period. The first driving electrode 30a is at the same potential with the DC voltage. The first driving electrode 30a and the second driving electrode 31a provide a second capacitor. In the second capacitor, an electrostatic force proportional to a voltage determined based on the DC voltage and the driving voltage is generated. The driving frame 24a having the first driving electrode 30a displaces in the X-axis direction due to an X-axis direction component in the electrostatic force. Because the polarity of the driving voltage changes with the predetermined period, the electrostatic force applied to the first driving electrode 30a changes in the X-axis direction with the predetermined period. Thus, the driving frame 24a having the first driving electrode 30a vibrates in the X-axis direction with the predetermined period.

The first monitoring electrode 33a and the second monitoring electrode 34a are provided for monitoring the driving state (vibrating state) of the driving frame 24a. On the monitoring beam 35a having the second monitoring electrode 34a, a fifth sensor pad 45 is disposed. The first monitoring electrode 33a and the second monitoring electrode 34a provide a third capacitor. The fifth sensor pad 45 outputs a signal in accordance with a change in an electrostatic capacity of the third capacitor. The first monitoring electrode 33a is at the same potential as the DC voltage. Thus, it is expected that a voltage depending on the DC voltage is generated at the second monitoring electrode 34a. In the present embodiment, the vibrating state of the driving frame 24a is monitored by monitoring the output signal of the second monitoring electrode 34a.

Next, the correspondence relationship between the detecting sections 21a and 21b will be described. The detecting section 21b includes an anchor 22b, a first driving beam 23, a driving frame 24b, a detecting beam 25b, a detecting frame 26, a first detecting electrode 27b, a second detecting electrode 28b, a servo electrode 29b, a first driving electrode 30b, a second driving electrode 31b, a second driving beam 32b, a first monitoring electrode 33b, a second monitoring electrode 34b, and a monitoring beam 35b. The anchor 22b corresponds to the anchor 22a. The first driving beam 23b corresponds to the first driving beam 23a. The driving frame 24b corresponds to the driving frame 24a. The detecting beam 25b corresponds to the detecting beam 25a. The detecting frame 26b corresponds to the detecting frame 26a. The first detecting electrode 27b corresponds to the first detecting electrode 27a. The second detecting electrode 28b corresponds to the second detecting electrode 28a. The servo electrode 29b corresponds to the servo electrode 29a. The first driving electrode 30b corresponds to the first driving electrode 30a. The second driving electrode 31b corresponds to the second driving electrode 31a. The second driving beam 32b corresponds to the second driving beam 32a. The first monitoring electrode 33b corresponds to the first monitoring electrode 33a. The second monitoring electrode 34b corresponds to the second monitoring electrode 34a. The monitoring beam 35b corresponds to the monitoring beam 35a.

As shown in FIG. 2, the second driving beam 32a and the second driving beam 32b disposed in the center portion of the sensor part 20 are integrated. The first sensor pad 41 is also disposed on the anchor 22b disposed in the center portion. The second sensor pad 42 is also disposed on the second detecting electrode 28b. The third sensor pad 43 is also disposed on the servo electrode 29b. The fourth sensor pad 44 is also disposed on the second driving beam 32b. The fifth sensor pad 45 is also disposed on the monitoring beam 35b.

As shown in FIG. 2, the driving frame 23a and the driving frame 24b are coupled through a coupling beam 15. The sensor pads 44 are applied with the driving voltage so that the driving frame 24a and the driving frame 24b vibrates in opposite phases. The polarity of the driving voltage applied to the fourth sensor pads 44 disposed on the second driving beams 32a and 32b arranged in the center portion is set to be opposite from the polarity of the driving voltage applied to the fourth sensor pads 44 disposed on the second driving beams 32a and 32b arranged in an edge portion so that the electrostatic force applied to the driving frame 24a can be opposite from the electrostatic force applied to the driving frame 24b in the X-axis direction. Accordingly, the driving frame 24a and the driving frame 24b vibrate in the opposite phases in the X-axis direction.

When an angular velocity is applied in the Z-axis direction while the driving frame 24a and the driving frame 24b (the detecting frame 26a and the detecting frame 26b) are vibrating in the X-axis direction in the opposite phases, the detecting frames 26 and 26b receive a Coriolis force in the Y-axis direction. When the detecting frames 26a and 26 displace in the Y-axis direction by the Coriolis force, the first detecting electrodes 27a and 27b disposed on the detecting frames 26a ad 26b also displace in the Y-axis direction. Thus, a distance between the first detecting electrode 27a and the second detecting electrode 28a and a distance between the first detecting electrode 27b and the second detecting electrode 28b changes, and thereby the electrostatic capacities of the second capacitors change. The changes in the electrostatic capacities are input to the circuit chip 50 through the second sensor pads 42, the bumps 70, and the circuit pads 54 of the circuit chip 50. The circuit chip 50 calculates the servo voltage that restrict the displacement of the detecting frames 26a and 26b in the Y-axis direction based on the changes in the electrostatic capacities. The calculated servo voltage is input to the servo electrodes 29a and 29b through the circuit pads 54, the bumps 70, and the third sensor pads 43.

A direction of the Coriolis force depends on the direction of the vibration. As described above, the detecting frame 26a and the detecting frame 26b vibrate in the X-axis direction in the opposite phases. Thus, the direction of the Coriolis force applied to the detecting frame 26a is opposite from the direction of the Coriolis force applied to the detecting frame 26b. As a result, the change in the electrostatic capacity of the second capacitor provided by the first detecting electrode 27a and the second detecting electrode 28a is opposite from the change in the electrostatic capacity of the second capacitor provided by the first detecting electrode 27b and the second detecting electrode 28b. In other words, when the electrostatic capacity of one of the second capacitors increases, the electrostatic capacity of the other one of the second capacitors decreases. The circuit chip 50 calculates the difference between the electrostatic capacities of the two second capacitors so as to detect the electrostatic capacity depending on the angular velocity.

The circuit chip 50 includes a semiconductor substrate 51, a circuit part 52, and a plurality of pads 53. The semiconductor substrate 51 has a first surface 51a and a second surface being opposite the first surface 51a. The circuit part 52 is formed on the first surface 51a and is configured to process the output signal of the sensor chip 10. The pads 53 include circuit pads 54 and outer pads 55. The circuit pads 54 are disposed on the first surface 51a so as to correspond to the sensor pads 40. The outer pads 55 are electrically coupled with the wires 92. The circuit part 52 inputs control signals to the sensor chip 10. The control signals include the DC voltage, the driving voltage, the servo voltage, and a constant voltage. The circuit chip 50 can function as a base member, and the circuit pads 54 can function as base pads. The first surface 11a of the semiconductor substrate 11 and the first surface 51a of the semiconductor substrate 51 are opposite each other.

The package 90 includes a housing 93 and a lid 94. The housing 93 has an opening portion 93a. The lid 94 covers the opening portion 93a. On a bottom inner surface of the housing 93, an adhesive 91 is disposed. The housing 93 and the circuit chip 50 are mechanically coupled through the adhesive 91. The housing 93 has inner terminals 95, inner wires 96, and outer terminals 97. The inner terminals 95 are disposed on inner surfaces of sidewalls of the housing 93. The inner wires 96 are disposed in the sidewalls of the housing 93. The outer terminals 97 are disposed on an outer surface of the bottom of the housing 93. The inner terminals 95 and the outer pads 55 of the circuit chip 50 are electrically coupled through the wires 92. Thus, the circuit chip 50 can be electrically coupled with an external device through the outer pads 55, the wires 92, the inner terminals 95, the inner wires 96, and the outer terminals 97. The housing 93 and the lid 94 are mechanically coupled by brazing.

The sensor pads 40 include the first sensor pads 41, the second sensor pads 42, the third sensor pads 43, the fourth sensor pads 44, the fifth sensor pads 45, and sixth sensor pads 46. As described above, the first sensor pads 41 are disposed on the anchors 22a and 22b, the second sensor pads 42 are disposed on the second detecting electrodes 28a and 28b, the third sensor pads 43 are disposed on the servo electrodes 29a and 29b, the fourth sensor pads 44 are disposed on the second driving beams 32a and 32b, and the fifth sensor pads 45 are disposed on the monitoring beams 35a and 35b. The sixth sensor pads 46 are disposed on a portion of the second semiconductor layer 14 where the pattern-etching is not performed. The circuit chip 50 inputs the constant voltage to the sixth sensor pads 46 so that the potential of the sensor chip 10 is maintained at the constant voltage.

Figure 4:
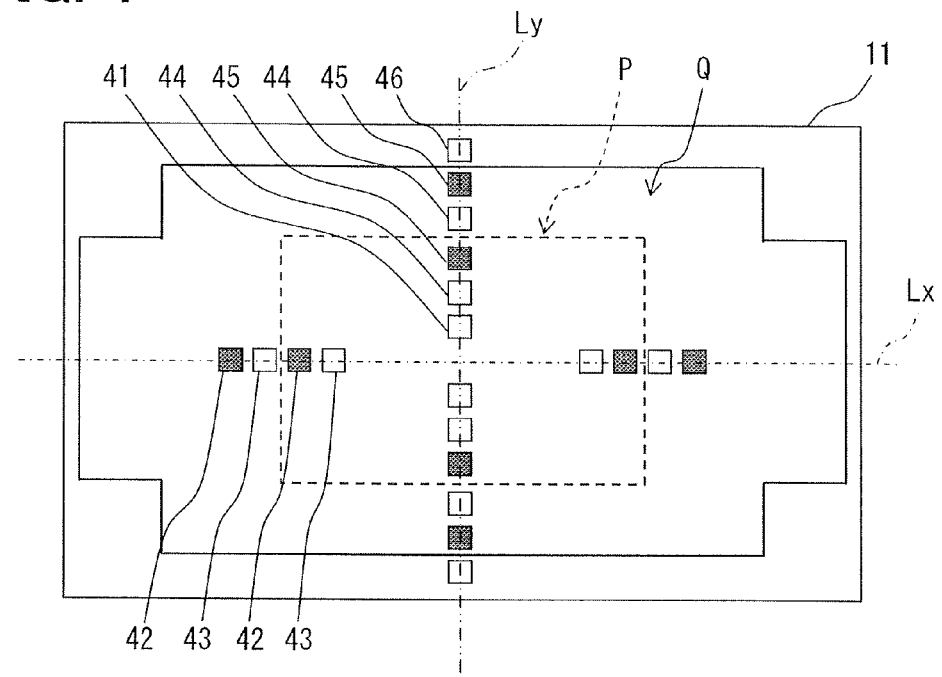
FIG. 4 is a plan view showing an example of an arrangement of sensor pads.

As shown in FIG. 4, the sensor pads 41-46 are disposed on the virtual straight lines Lx and Ly, that is, on the cross line. The second sensor pads 42 and the fifth sensor pads 45 are configured to output the signals of the sensor chip 10 to an external device and can function as output pads. On the first surface 11a of the semiconductor substrate 11, a part of the second sensor pads 42 and the fifth sensor pads 45 is disposed in an edge portion Q that surrounds a center portion P. In other words, a part of the output pads is disposed in the edge portion Q. The sensor pads 41, 43, 44, 46 can function as input pads for inputting a signal to the sensor part 20.

Figure 5:
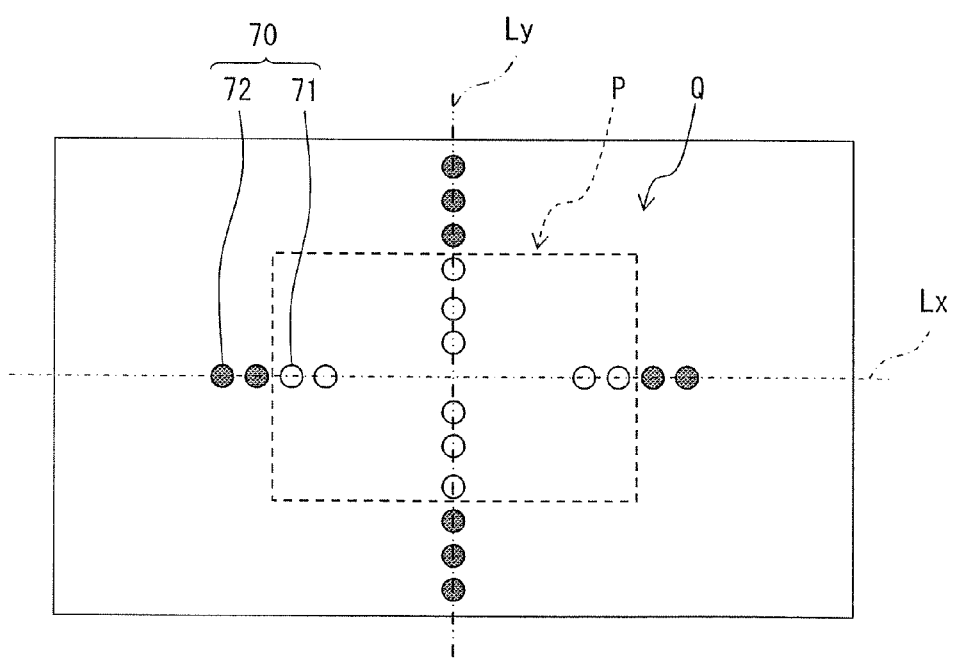
FIG. 5 is a plan view showing an example of an arrangement of bumps.

Because the bumps 70 are coupled with the sensor pads 40, the bumps 70 are also disposed on the virtual straight line Lx and Ly as shown in FIG. 5. The bumps 70 include center bumps 71 disposed in the center portion P and edge bumps 72 disposed in the edge portion Q. In FIG. 4 and FIG. 5, the sensor pads 42 and 45 and the edge bumps 72 are illustrated with hatching for the sake of convenience.

Figure 6A:
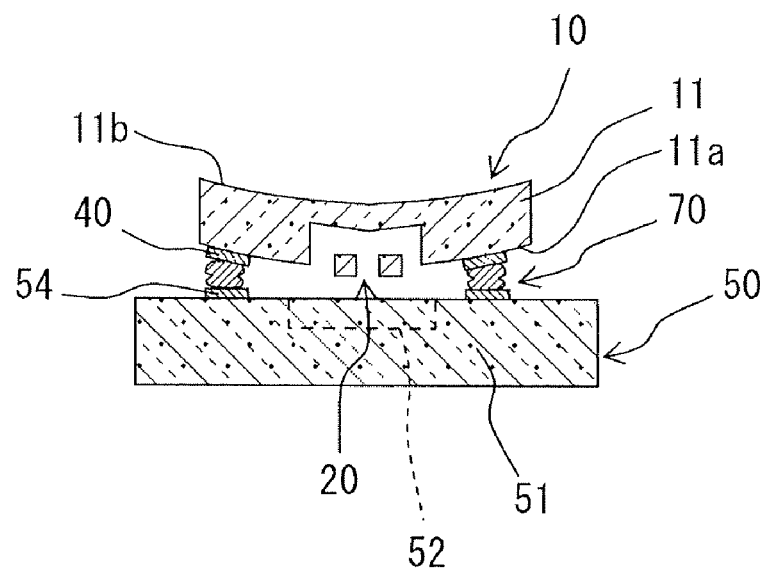
FIG. 6A is a cross-sectional view of a dynamic quantity sensor in which a semiconductor substrate is curved in such a manner that a center portion is convex with respect to a circuit chip compared with an edge portion.

As shown in FIG. 6A, the sensor chip 10 and the circuit chip 50 are coupled through the bumps 70 in a state where the semiconductor substrate 11 is curved and the center portion P of the semiconductor substrate 11 is convex with respect the circuit chip 50 compared with the edge portion Q. A distance between the semiconductor substrate 11 and the semiconductor substrate 51 increases from the center portion P to the edge portion Q. Thus, the edge bumps 72 that couple the sensor pads 40 in the edge portion Q and the circuit pads 54 are applied with tensile stress in a direction separating the semiconductor substrate 11 and the semiconductor substrate 51. Therefore, the edge bumps 72 are liable to crack and the edge bumps 72 are liable to be detached from the sensor pads 40 and the pads 53. That is, a bad connection is liable occur at the edge bumps 72.

The semiconductor substrate 11 can be curved in such a manner that the center portion P is convex with respect to the circuit chip 50 compared with the edge portion Q by setting a pressure applied to the center portion P to be larger than a pressure applied to the edge portion Q in a manufacturing process for mechanically and electrically coupling the sensor chip 10 and the circuit chip 50 through the bumps 70.

In the dynamic quantity sensor 100 according to the present embodiment, a part of the second sensor pads 42 and the fifth sensor pads 45 for outputting the signals of the sensor chip 10 to an external device is disposed in the edge portion Q. Thus, the second sensor pads 42 and the fifth sensor pads 45 disposed in the edge portion Q are coupled with the edge bumps 72. As described above, the edge bumps 72 are liable to crack and the edge bumps 72 are liable to be detached from the sensor pads 40 and the circuit pads 54. The output signal from the second sensor pads 42 and the fifth sensor pads 45 are affected by a bad connection of the edge bumps 72. Thus, by checking the output signals from the second sensor pads 42 and the fifth sensor pads 45 coupled with the edge bumps 72, it can be determined whether a bad connection occurs at the edge bumps 72. When a bad connection occurs at the edge bumps 72, a connection resistance of the sensor pads 40 and the circuit pads 54 increases and amplitude of the output signal becomes smaller than an expected value. Therefore, it can be determined whether a bad connection occurs between the sensor chip 10 and the circuit chip 50 by determining whether the amplitude of the output signal is smaller than the expected value.

In the dynamic quantity sensor 100 according to the present embodiment, the servo voltage that is determined based on the output signal of the second sensor pads 42 is detected as the physical quantity for determining the angular velocity. Because the angular velocity is detected not based on the change in the electrostatic capacity of the first capacitor provided by the first detecting electrode 27a and the second detecting electrode 28a but based on the servo voltage input to the servo electrode 29a for restricting the vibration, the dynamic quantity sensor 100 can restrict a decrease in a detection accuracy of the angular velocity due to the vibration.

Although the present invention has been fully described in connection with the exemplary embodiments thereof with reference to the accompanying drawings, it is to be noted that various changes and modifications will become apparent to those skilled in the art.

In the above-described embodiment, the sensor part 20 is configured to detect angular velocity as an example of a dynamic quantity. The sensor part 20 may also configured to detect acceleration as another example of a dynamic quantity.

In the above-described embodiment, the base member is a circuit chip 50. The base member may also have another configuration. For example, the base member may be an interposer for electrically coupling substrates having different terminal pitches.

In the above-described embodiment, a part of the second sensor pads 42 and the fifth pads 45 is disposed in the edge portion Q. All of the second sensor pads 42 and the fifth sensor pads 45 may also be disposed in the edge portion Q. In this case, all of the changes in the output signals due to a bad connection can be detected. Thus, it can be determined whether a bad connection occurs between the sensor chip 10 and the circuit chip 50 more accurately than a case where a part of the second sensor pads 42 and the fifth sensor pads 45 is disposed in the edge portion Q.

In the above-described embodiment, the sensor pads 41, 43, 44, 46 are disposed in the center portion P and the edge portion Q. Alternatively, all of the sensor pads 41, 43, 44, 46 may also be disposed in the center portion P. In a case where an input signal is affected by a bad connection, the amplitude of the output signal does not changes and a waveform of the output signal changes. Thus, it becomes difficult to compare the output signal and the expected value. For example, when a bad connection occurs at the bump 70 coupled with the sensor pad 44, the driving signal output from the sensor pad 44 changes and the vibrating states of the detecting frames 26a and 26b change. Thus, the waveform of the signals output from the sensor pads 42 and 45 may change. In the above-described configuration, the input signal is difficult to be affected by a bad connection of the bumps 70. Thus, it can be determined with accuracy whether a bad connection occurs between the sensor chip 10 and the circuit chip 50.

In the above-described embodiment, the first surface 11a of the semiconductor substrate 11 is opposite the surface 51a of the semiconductor substrate 51. Alternatively, a second surface 11b of the semiconductor substrate 11 may be opposite the surface 51a of the semiconductor substrate 51. In this case, the sensor chip 10 further includes penetrating electrodes that penetrate the semiconductor substrate 11 from the first surface 11a to the second surface 11b, and the sensor pads 40 are provided by portions of the penetrating electrodes that are exposed to a second-surface side of the semiconductor substrate 11.

Figure 6B:
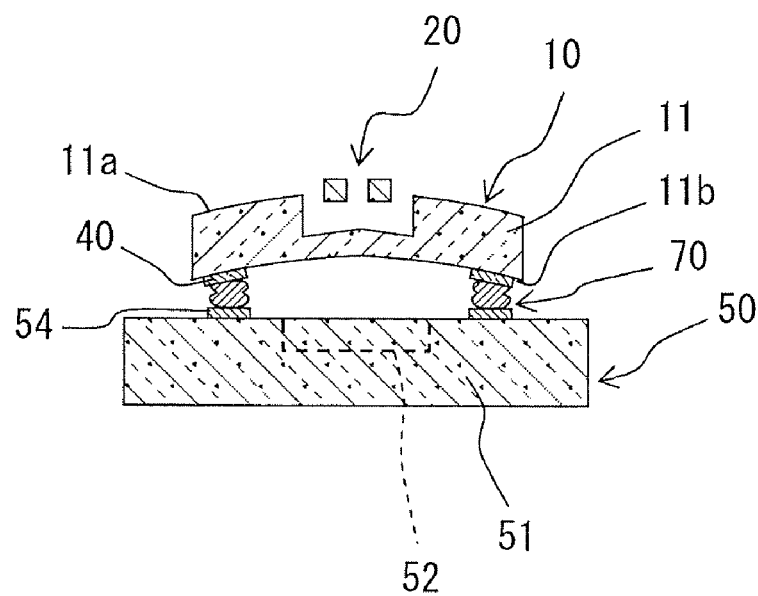
FIG. 6B is a cross-sectional view of a dynamic quantity sensor in which a semiconductor substrate is curved in such a manner that a center portion is concave with respect to a circuit chip compared with an edge portion.
Figure 7A:
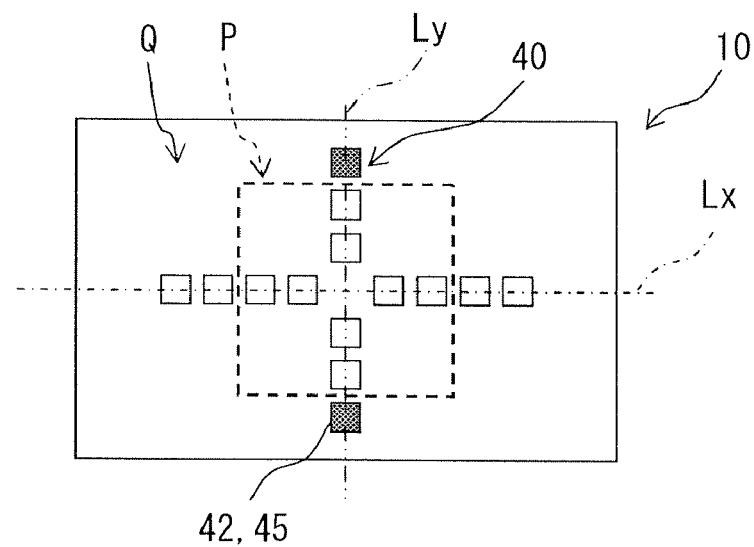
FIG. 7A is a plan view showing another example of the arrangement of the sensor pads in which the sensor pads are arranged on a cross line and output pads are arranged in an edge portion.
Figure 7B:
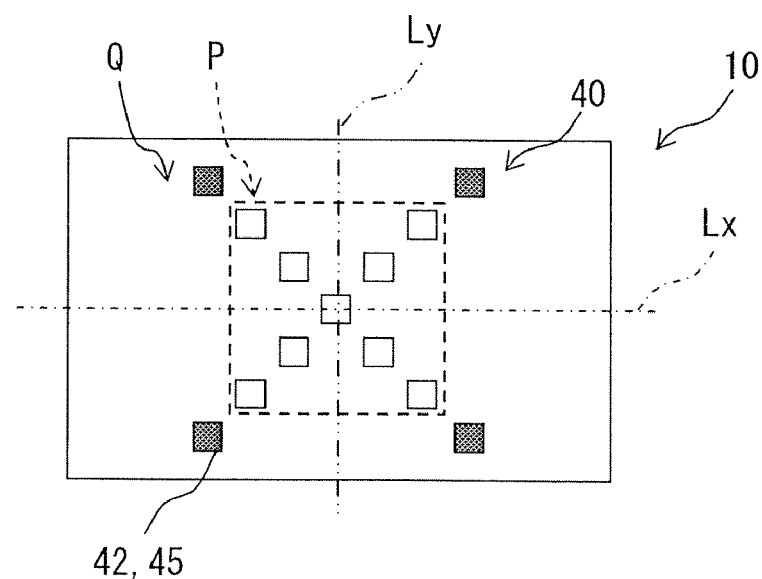
FIG. 7B is a plan view showing another example of the arrangement of the sensor pads in which the sensor pads are arranged on a diagonal cross line and the output pads are arranged in the edge portion.
Figure 8A:
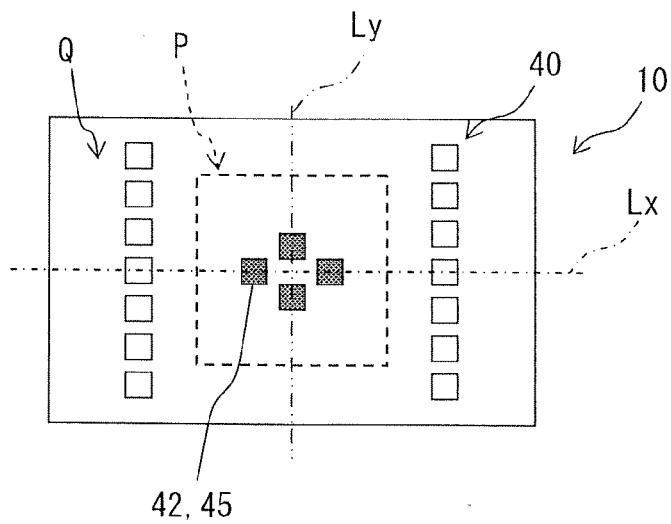
FIG. 8A is a plan view showing another example of the arrangement of the sensor pads in which the output pads are arranged in the center portion and other pads are arrange in two lines.
Figure 8B:
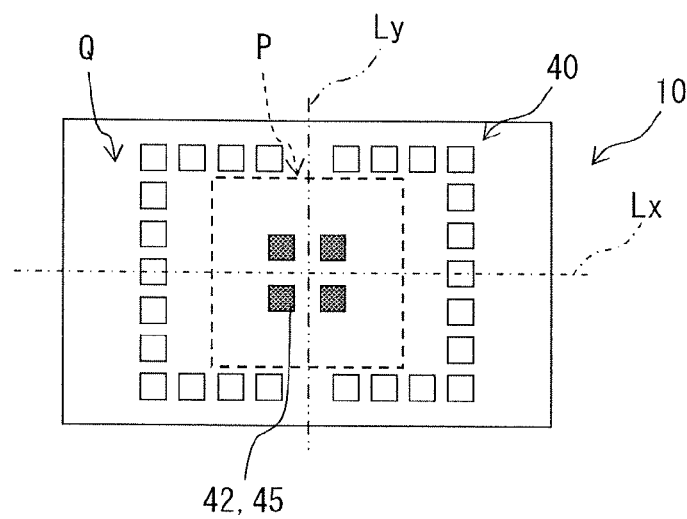
FIG. 8B is a plan view showing another example of the arrangement of the sensor pads in which the output pads are arranged in the center portion and the other pads are arranged in a frame form.
Figure 8C:
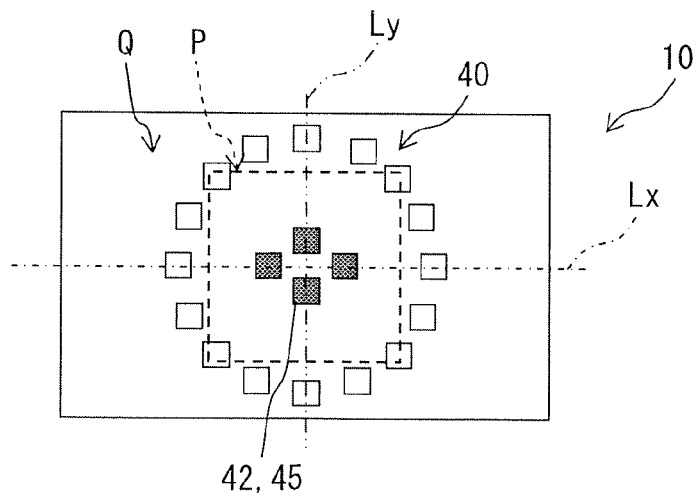
FIG. 8C is a plan view showing another example of the arrangement of the sensor pads in which the output pads are arranged in the center portion and the other pads are arranged in a round form.

In the above-described embodiment, the semiconductor substrate 11 is coupled with the circuit chip 50 through the bumps 70 in the state where the semiconductor substrate 11 is curved and the center portion P of the semiconductor substrate 11 is convex with respect to the circuit chip 50 compared with the edge portion Q as shown in FIG. 6A. The semiconductor substrate 11 may also be coupled with the circuit chip 50 through the bumps 70 in a state where the semiconductor substrate 11 is curved and the center portion P of the semiconductor substrate 11 is concave with respect to the circuit chip 50 compared with the edge portion Q as shown in FIG. 6B. In this case, the second sensor pads 42 and the fifth sensor pads 45 for outputting the signals of the sensor chip 10 to an external device is disposed in the center portion P, for example, as shown in FIG. 8A to FIG. 8C. The semiconductor substrate 11 can be curved in such a manner that the center portion P is concave with respect to the circuit chip 50 compared with the edge portion Q by setting a pressure applied to the edge portion Q to be larger than a pressure applied to the center portion P in a manufacturing process for mechanically and electrically coupling the sensor chip 10 and the circuit chip 50 through the bumps 70.

In the above-described case, a distance between the semiconductor substrate 11 and the semiconductor substrate 51 decreases from the center portion P to the edge portion Q. Thus, the center bumps 71 that couple the sensor pads 40 in the center portion P and the circuit pads 54 are applied with tensile stress in a direction separating the semiconductor substrate 11 and the semiconductor substrate 51. Therefore, the center bumps 71 are liable to crack or the center bumps 71 are liable to be detached from the sensor pads 40 and the circuit pads 54. That is, a bad connection is liable to occur at the center bumps 71. Because the second sensor pads 42 and the fifth sensor pads 45 are disposed in the center portion P, the output signals from the second sensor pads 42 and the fifth sensor pads 45 are affected by a bad connection of the center bumps 71. Thus, by checking the output signals from the second sensor pads 42 and the fifth sensor pads 45 coupled with the center bumps 71, it can be determined whether a bad connection occurs at the center bumps 71. In the example shown in FIG. 6B, the second surface 11b of the semiconductor substrate 11 is opposite the first surface 51a of the semiconductor substrate 51. Alternatively, the first surface 11a of the semiconductor substrate 11 may be opposite the first surface 51a of the semiconductor substrate 51.

The sensor pads 40 may be arranged in various forms, for example, as shown in FIG. 7A to FIG. 8C. In an example shown in FIG. 7A, the sensor pads 40 are arranged on the virtual straight lines Lx and Ly, and the second sensor pads 42 and the fifth sensor pads 45 are arranged in the edge portion Q. In an example shown in FIG. 7B, the sensor pads 40 are arranged on a diagonal cross line, and the second sensor pads 42 and the fifth sensor pads 45 are arranged in the edge portion Q. In an example shown in FIG. 8A, the second sensor pads 42 and the fifth sensor pads 45 are arranged in the center portion P and the other sensor pads 41, 43, 44, 46 are arranged in the edge portion P in two lines. In an example shown in FIG. 8B, the second sensor pads 42 and the fifth sensor pads 45 are arranged in the center portion P and the other sensor pads 41, 43, 44, and 46 are arranged in the edge portion Q in a frame form. In an example shown in FIG. 8C, the second sensor pads 42 and the fifth sensor pads 45 are arranged in the center portion P and the other sensor pads 41, 43, 44, and 46 are arranged in a round form. The other sensor pads 41, 43, 44, 46 may also be arranged in the center portion P. In FIG. 7A to FIG. 8C, the second sensor pads 42 and the fifth sensor pads 45 are illustrated with hatching for the sake of convenience.

What is claimed is:
1. A dynamic quantity sensor comprising:
a sensor chip including a semiconductor substrate, a sensor part formed on the semiconductor substrate, and a plurality of first pads disposed on a surface of the semiconductor substrate and electrically coupled with the sensor part;
a base member including a substrate and a plurality of second pads disposed on a surface of the substrate opposing to the surface of the semiconductor substrate; and a plurality of bumps mechanically and electrically coupling the plurality of first pads and the plurality of second pads, wherein the sensor chip is coupled with the base member in a state where the sensor chip is curved with respect to the base member, wherein the plurality of first pads includes a plurality of first input pads that inputs a signal to the sensor part and a plurality of first output pads that outputs a signal from the sensor part, wherein one of the plurality of first input pads is disposed on a portion of the surface of the semiconductor substrate at which an opposing distance between the sensor chip and the base member is shorter, and wherein one of the plurality of first output pads is disposed on a portion of the surface of the semiconductor substrate at which an opposing distance between the sensor chip and the based member is longer.

2. The dynamic quantity sensor according to claim 1, wherein all of the plurality of first input pads are disposed on the portion of the surface of the semiconductor substrate at which the opposing distance between the sensor chip and the base member is shorter, and wherein all of the plurality of first output pads are disposed on the portion of the surface of the semiconductor substrate at which the opposing distance between the sensor chip and the base member is longer.

3. The dynamic quantity sensor according to claim 1, wherein the sensor chip is curved in such a manner that a center portion of the semiconductor substrate is convex or concave with respect to an edge portion that surrounds the center portion, and wherein the plurality of first pads is arranged on a cross line that crosses in the center portion.

4. The dynamic quantity sensor according to claim 1, wherein the sensor part includes:

an anchor;

a driving frame coupled with the anchor through a first driving beam;

a detecting frame coupled with the driving frame through a detecting beam;

a first detecting electrode disposed on the detecting frame;

a second detecting electrode opposing the first detecting electrode;

a servo electrode restricting a displacement of the detecting frame based on an output signal of the second detecting electrode;

a first driving electrode disposed on the driving frame;

a second driving electrode opposing the first driving electrode; and a second driving beam on which the second driving electrode is disposed, wherein the plurality of first input pads includes a pad disposed on the anchor, a pad disposed on the servo electrode, and a pad disposed on the second driving beam, and wherein the plurality of first output pads includes a pad disposed on the second detecting electrode.

5. The dynamic quantity sensor according to claim 4, wherein the sensor chip further includes a first monitoring electrode disposed on the driving frame, a second monitoring electrode corresponding to the first monitoring electrode, and a monitoring beam on which the second monitoring electrode is disposed, and wherein the plurality of first output pads includes a pad disposed on the monitoring beam.

6. The dynamic quantity sensor according to claim 1, further comprising:

a package defining an inner space where the sensor chip and the base member are housed;

an inner terminal disposed on an inner surface of the package;

an inner wire electrically coupled with the inner terminal and disposed in the package; and an outer terminal electrically coupled with the inner wire and disposed on an outer surface of the package, wherein the base member is a circuit chip in which a circuit part processing the signal output from the sensor chip is disposed on the substrate, wherein the base member further includes an outer pad on the surface of the substrate in addition to the plurality of second pads, and the outer pad is electrically coupled with the inner terminal through a wire, and wherein an adhesive is disposed on a rear surface of the substrate and the substrate is fixed to a bottom inner surface of the package through the adhesive.

7. The dynamic quantity sensor according to claim 1, wherein the sensor part is disposed on the surface of the semiconductor substrate.

8. The dynamic quantity sensor according to claim 1, wherein the sensor part is disposed on a rear surface of the semiconductor substrate, and wherein sensor chip further includes a plurality of penetrating electrodes that penetrates the semiconductor substrate from the surface to the rear surface, and the plurality of first pads is provided by a portion of the plurality of penetrating electrodes exposed on the rear surface of the semiconductor substrate.

9. A method of manufacturing the dynamic quantity sensor according to claim 1, comprising mechanically and electrically coupling the sensor chip and the base member through the plurality of bumps while applying a pressure to the sensor chip so that the sensor ship is curved with respect to the base member.

* * * * *